United States Patent [19]

Aoyama

[11] Patent Number: 4,656,608
[45] Date of Patent: Apr. 7, 1987

[54] SEMICONDUCTOR MEMORY DEVICE

[75] Inventor: Keizo Aoyama, Yamato, Japan

[73] Assignee: Fujitsu Limited, Kawasaki, Japan

[21] Appl. No.: 737,076

[22] Filed: May 23, 1985

[30] Foreign Application Priority Data

May 30, 1984 [JP] Japan .................. 59-110291

[51] Int. Cl.$^4$ ............................... G11C 7/00
[52] U.S. Cl. .................... 365/190; 365/203
[58] Field of Search ........... 365/190, 202, 203, 154, 365/230

[56] References Cited

U.S. PATENT DOCUMENTS 4,003,035  1/1977  Hoffman et al. ............ 365/149 X
4,355,377  10/1982  Sud et al. ..................... 365/203

FOREIGN PATENT DOCUMENTS

57-150188  9/1982  Japan .

Primary Examiner—Joseph A. Popek
Attorney, Agent, or Firm—Staas & Halsey

[57] ABSTRACT

A semiconductor memory device includes at least a pair of bit lines, a word line, a pair of load transistors each connected to the bit lines, a memory cell connected to the bit lines and the word line and selected by an address signal, and an equalizing circuit connected between each of the bit lines. According to the present invention, the equalizing circuit comprises an P-channel type MIS transistor and an N-channel type MIS transistor that are connected in parallel and temporarily turned ON in response to a change of the address signal.

9 Claims, 12 Drawing Figures

SEMICONDUCTOR MEMORY DEVICE

BACKGROUND OF THE INVENTION

1. Field of the Invention

The present invention relates to a semiconductor memory device. More particularly, it relates to a semiconductor memory device having an improved circuit for temporarily equalizing the potential of the complementary signal lines when changing an address signal.

2. Description of the Related Art

A semiconductor memory device having a plurality of static type memory cells, especially non-synchronous type memory cells, comprises at least a pair of bit lines, a word line, a pair of load transistors each connected to a bit line, and a static type memory cell having a plurality of transistors and two load resistors.

In this type of memory cell, the writing and reading of information to and from the memory cell is performed by changing the potential of bit lines having a complementary relationship, i.e., one bit line has a high potential and the other bit line has a low potential.

Therefore, access time to the memory cell is determined mainly by the speed of the change in potential of the bit lines.

Japanese Unexamined Patent Publication (Kokai) No. 57-150188, for example, discloses a technique for reducing the access time to the memory cell by providing a circuit for temporarily equalizing the potential of the complementary bit lines when changing the address signal.

Such a circuit, however, does not sufficiently reduce the access time to the memory cell, because a transistor used for equalizing does not turn ON completely at the time that the changing of the potential ends.

This problem will be explained in detail hereinafter.

SUMMARY OF THE INVENTION

The object of the present invention is to provide a semiconductor memory device including a non-synchronous type memory cell and an improved equalizing circuit having metal-insulator-semiconductor (MIS) transistors, thereby enabling high speed writing and reading access to the memory cell.

In accordance with the present invention, there is provided a semiconductor memory device including a memory cell selected by an address signal, at least a pair of signal lines for receiving a complementary signals corresponding to information stored in said memory cell, and an equalizing circuit connected between each of the signal lines for equalizing the potential of said signal lines. According to the present invention, the equalizing circuit includes a P-channel type MIS transistor and an N-channel type MIS transistor each connected in parallel, wherein the P-channel type MIS transistor and the N-channel type MIS transistor are temporarily turned ON in response to a change of the address signal.

DESCRIPTION OF THE PREFERRED EMBODIMENTS

Before describing the preferred embodiments, an explanation will be given of a semiconductor memory device having a conventional equalizing circuit.

Figure 1:
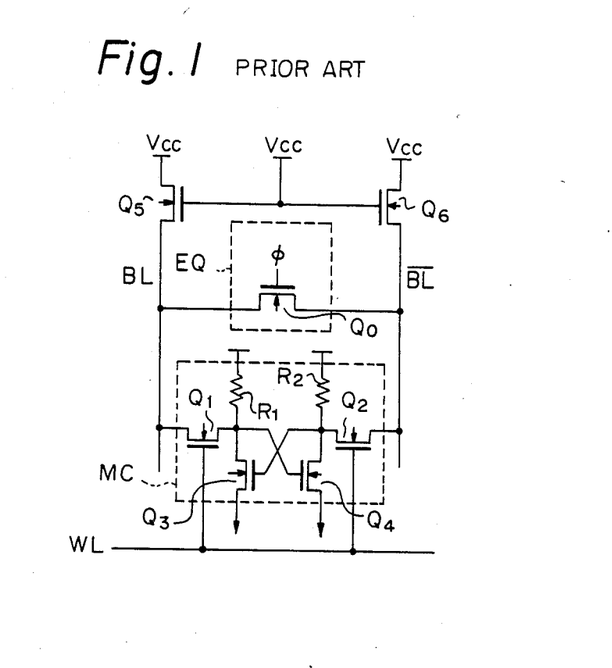
FIG. 1 is a semiconductor memory device having a conventional equalizing circuit.

In FIG. 1, MC is a static type memory cell comprising transfer gate transistors $Q_1$, $Q_2$, drive transistors $Q_3$, $Q_4$, and load resistors $R_1$, $R_2$. The MC is connected to a word line WL and a pair of bit lines BL, $\overline{BL}$ through the transfer gates $Q_1$, $Q_2$. EQ is a circuit for equalizing the potential of bit lines BL, $\overline{BL}$ and is connected between each of the bit lines BL, $\overline{BL}$. The EQ comprises an N-channel or P-channel type MIS transistor $Q_0$. (A resistor also can be used for the equalizing circuit instead of a transistor.) The transistor $Q_0$ is temporarily turned ON during the changing of an address by a clock signal $\phi$ which is applied to a gate thereof. Transistors $Q_5$, $Q_6$ are load transistors, each of which is connected to one of the bit lines BL, $\overline{BL}$ as a load. Each $V_{CC}$ is a power source.

Since each of the bit lines BL, $\overline{BL}$ is connected to the power source $V_{CC}$ through each of the transistors $Q_5$, $Q_6$, each of the potentials of BL, $\overline{BL}$ is at the same level when the word line WL is in the non-selection state. When the word line WL is in the selection state and a read operation occurs, the potential is changed between BL and $\overline{BL}$ and the data is read from the memory cell MC. Moreover, when converse data (high→low or low→high) is read from the memory cell MC by changing the polarity of the word line WL, it is necessary to change the potential between BL and $\overline{BL}$ to the converse potential after both potentials of BL, $\overline{BL}$ are made temporarily zero.

Therefore, the equalizing circuit EQ shown in FIG. 1 is provided between BL and $\overline{BL}$ in order to speed up the change of potential thereof.

Figure 2:
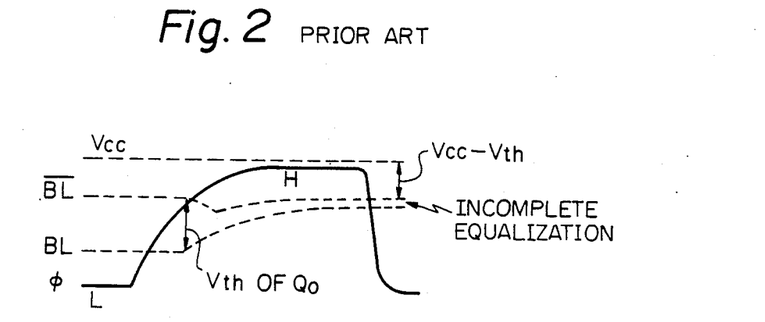
FIG. 2 shows waveforms of the change of the potentials at bit lines caused by the equalizing circuit shown in FIG. 1.

FIG. 2 shows waveforms of the change of the potential at bit lines BL, $\overline{BL}$ caused by the equalizing circuit EQ shown in FIG. 1. In this case, the transistor $Q_0$ is an N-channel type transistor. When the clock signal $\phi$ rises to a high level, the transistor $Q_0$ turns ON and the bit lines BL, $\overline{BL}$ are connected to each other. Accordingly, the potential of bit line BL (or $\overline{BL}$) is equalized to the potential of bit line $\overline{BL}$ (or BL).

As mentioned above, the previous potential of the bit line is cancelled by using the transistor $Q_0$, which is turned ON temporarily by the clock signal $\phi$ during the change of the word line WL. Consequently, when converse data is read from the memory cell MC in the next timing, since the bit lines BL, $\overline{BL}$ both have the same potential, i.e. $V_{cc} - V_{th}$, the converse data can be read at a high speed from the memory cell MC.

In the N-channel type transistor $Q_0$, however, the equalization of the potential of the bit lines BL, $\overline{BL}$ is incomplete, as shown by a dotted line in FIG. 2, in the predetermined term. This is because the transistor $Q_0$ is cut off before the potential of the bit line is completely equalized to the potential of the other bit line. The cutting off of the transistor $Q_0$ is caused by the relationship between the gate potential and the source potential of the transistor $Q_0$. As can be seen from FIG. 1, the source potential of the transistor $Q_0$ is equal to the bit line potential.

As shown in FIG. 2, when the clock signal $\phi$ approaches the high level, the gate potential due to the clock signal approaches the potential of the bit line BL (or $\overline{BL}$). As a result, the gate-source voltage $V_{GS}$ of the transistor $Q_0$ falls and an internal resistance value of the transistor $Q_0$ is increased, and thus an overdrive capacity (drive ability of the transistor determined by the difference between the gate and source voltage) is reduced because the $V_{GS}$ becomes approximately $V_{th}$; where $V_{th}$ is a threshold level of the transistor $Q_0$.

Consequently, the equalization of the potential of bit lines BL, $\overline{BL}$ is incomplete when using the N-channel transistor $Q_0$.

When the transistor $Q_0$ is the P-channel type, other problems occur as explained below. That is, the mobility of a "hole" which passes the current in the P-channel transistor is lower than that of an "electron" in the N-channel transistor. Therefore, where the W/L (W: channel width, L: channel length) is the same as that of the N-channel type transistor, the mutual conductance (gm) of the P-channel type is smaller than that of the N-channel type. Consequently, when the P-channel type is used as the transistor $Q_0$, the speed of equalization is slower than that of the N-channel typek, at the same W/L.

A semiconductor memory device having an improved equalizing circuit according to an embodiment of the present invention will be explained in detail below.

Figure 3:
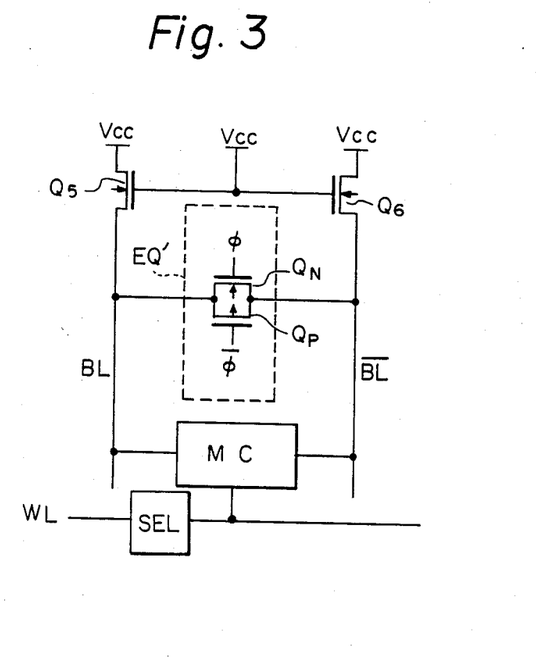
FIG. 3 is a semiconductor memory device having an equalizing circuit according to an embodiment of the present invention.

FIG. 3 shows a semiconductor memory device having an improved equalizing circuit. In FIG. 3, the same reference letters as those of FIG. 1 are associated with the same elements as in FIG. 1. As is obvious from the drawing, an equalizing circuit EQ' according to the present invention comprises a pair of transistors $Q_N$, $Q_P$. The transistor $Q_N$ is an N-channel type MIS transistor and $Q_P$ is a P-channel type MIS transistor. These transistors $Q_N$, $Q_P$ are connected to each other through a source and a drain thereof.

One clock signal $\phi$ which is at a high level when changing the word line WL (for example, from a nonselection to a selection state) is applied to a gate of the transistor $Q_N$, and the other converse clock signal $\overline{\phi}$ which is at a low level when changing the word line WL (for example, from a selection to a non-selection state by a select circuit SEL indicated in FIG. 3) is applied to a gate of the transistor $Q_P$.

Figure 4:
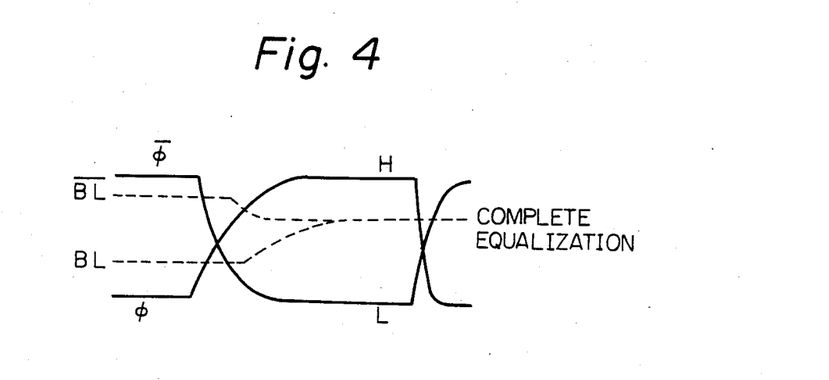
FIG. 4 shows waveforms of the change of the potentials at bit lines caused by the equalizing circuit shown in FIG. 3.

FIG. 4 shows waveforms of the change of the potential of bit lines BL, $\overline{BL}$ by the equalizing circuit EQ'. When the clock signal $\phi$ rises to a high level, the transistor $Q_N$ turns ON. At the same time when the clock signal $\overline{\phi}$ falls to a low level, the transistor $Q_P$ turns ON. As a result, the potential of the bit lines BL and $\overline{BL}$ is completely equalized.

In this case, the mutual conductance gm of the N-channel type transistor is large at the beginning of, and is small at the end of, the clock signal. On the other hand, that of the P-channel type transistor is small at the beginning of and is large at the end of, the clock signal. Therefore, by using the combination of N-channel and P-channel type MIS transistors, it is possible to cause a complete equalization between each of the bit lines. That is, the N-channel type transistor is mainly effected during the first half of the equalizing operation, and the P-channel type transistor is mainly effected during the latter half of the equalizing operation.

Figure 5:
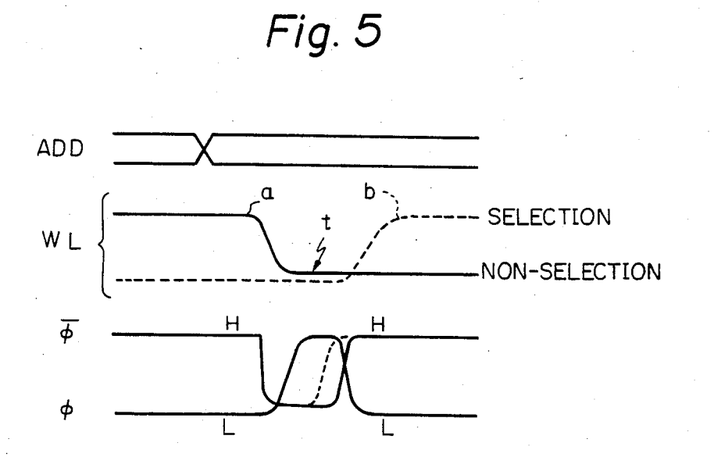
FIG. 5 is a timing chart of the clock signals with respect to the change of an address signal and of the selection non-selection of the word line.

FIG. 5 is a timing chart of the clock signals $\phi$, $\overline{\phi}$ with respect to the change of an address signal ADD and change of the selection and non-selection state of the word line WL. In FIG. 5, ADD is a row address signal and the position where lines cross indicates a change of the address signal. When the address signal is changed from high to low, or from low to high, the word line WL of the previous cycle shown by "a" is changed from the selection to the non-selection state (indicated by a solid line) and the word line WL of the next cycle shown by "b" is changed from the non-selection to the selection state (indicated by a dotted line). In this case, the word lines "a", "b" are in the non-selection state during a term "t". Equalization between each of the bit lines is performed during the term "t". In accordance with this embodiment of the present invention, the P-channel type MIS transistor $Q_P$ is previously turned On by utilizing the feature wherein the mutual conductance gm of the P-channel type is small from the beginning to midway of the leading edge, and the N-channel type MIS transistor $Q_N$ is turned ON after the word line "a" is completely in the non-selection state because the mutual conductance gm of the N-channel type is small in from the midway to the end of the leading edge.

The clock signal $\overline{\phi}$ is applied to the transistor $Q_P$ in such a manner that it falls from the high level to the low level at a timing that is slightly delayed compared with that of the word line "a", in order to obtain a high speed access time and high stability during writing and reading.

The clock signal $\phi$ is applied to the transistor $Q_N$ in such manner that it rises from a low level to the high level after the word line "a" is completely in a non-selection state.

In the preferred embodiments, the clock signal $\overline{\phi}$ rises from the low level to the high level before the clock signal $\phi$ falls from the high level to the low level as shown by dotted line in FIG. 5 during the period from midway to the end of the leading edge. This is because the overdrive capacity of the P-channel MIS transistor $Q_P$, turned ON by the clock signal $\overline{\phi}$, becomes large during the period from midway to the end of the leading edge, so that it is unnecessary to maintain the transistor $Q_P$ in a turned-on state after the potential of the bit lines is completely equalized. Accordingly, the N-channel type MIS transistor $Q_N$ is turned ON by the clock signal $\phi$ during this term.

The equalizing effect can be obtained in such a manner that it is "weak" at an initial step, "strong" at an intermediate step, and again "weak" at an end step in the equalizing operation according to the present invention.

As explained above, the equalization of the bit lines BL, BL is performed by utilizing an equalizing period between the non-selection of the word line at the previous cycle and the selection of the word line at the next cycle.

To attain an ideal equalizing operation, the equalization should start after the word line at the previous cycle is completely in a non-selection state, and should end when the word line at the next cycle is in a completely selection state. However, in practical use, the equalizing timing margin is very short when changing the word line. Therefore, the equalizing term overlaps the trailing edge to the non-selection and the leading edge to the selection in order to obtain high speed access. When the overlapped term is too long, i.e., the equalizing effect is too "strong", an adverse influence is caused to the stability and access time of the memory cell MC.

That is, when the equalizing operation is started before the word line is completely changed to the non-selection state, the bit lines BL and BL have the same potential, and both the input/output of the memory cell MC have the same potential. Accordingly, in this case, the memory cell MC may be inverted to an unsuitable condition prior to a suitable read or write operation. Similarly, when the equalizing operation is continued after the word line of the next cycle is selected, the information to be read out in this cycle is inverted in the memory cell.

Figure 6:
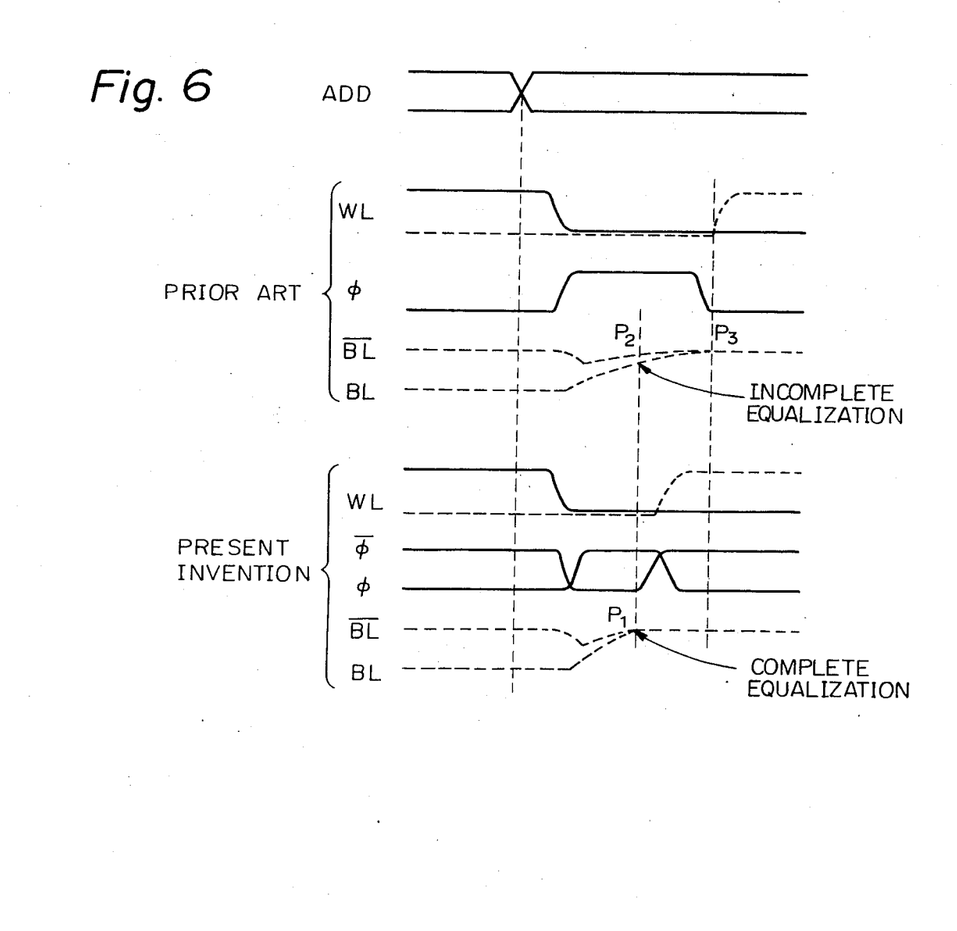
FIG. 6 is a timing chart for comparing the prior art with the present invention.

Consequently, based on the above-reasoning the timings of both clock signals $\phi$ and $\bar{\phi}$ are determined as shown in FIGS. 5 and 6.

FIG. 6 is a timing chart for comparing the prior art with the present invention. Accordingly, this timing chart explains timings shown in FIGS. 2, 4, and 5. As can be seen from the drawing, the equalizing timing of the present invention is shown by point $P_1$, and the equalizing timing of the prior art is shown by point $P_3$. The equalization is incomplete at the same point $P_2$ in the prior art, which is the same as the point $P_1$ in the present invention for the reasons explained above. Therefore, as is obvious when comparing the point $P_1$ with the point $P_3$, the access time according to the present invention is considerably shorter than that of the prior art.

Figure 7:
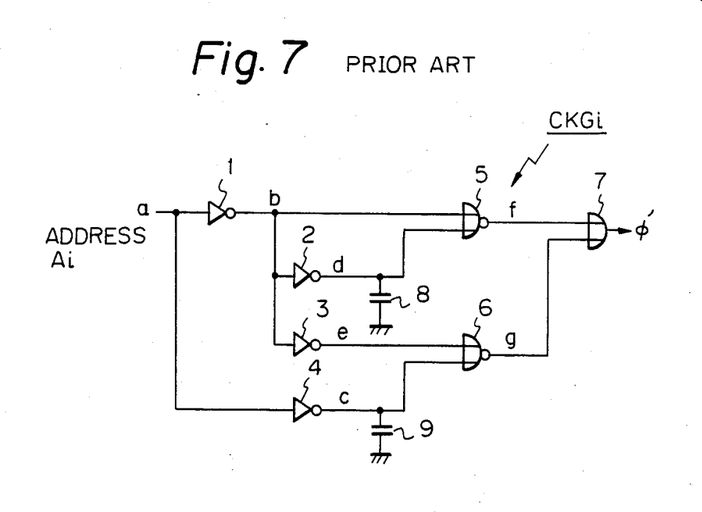
FIG. 7 is a conventional circuit for generating a clock signal $\phi'$ based on an address signal.
Figure 8:
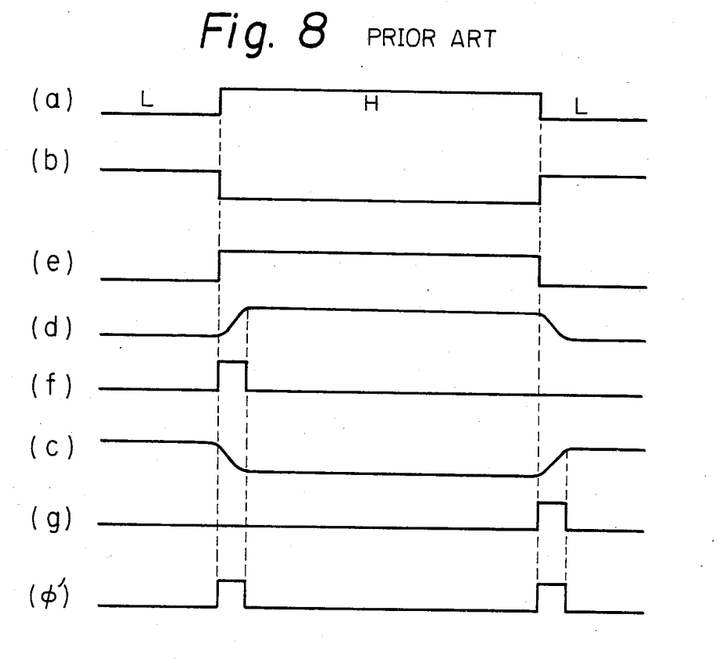
FIG. 8 is a timing chart at each point of the circuit shown in FIG. 7.

FIG. 7 is a conventional circuit for generating a clock signal $\phi'$ based on the change of an address Ai. FIG. 8 is a timing chart at each point of the circuit $CKG_i$ shown in FIG. 7. In FIG. 7, reference numbers 1, 2, 3 and 4 are inverters, 5 and 6 are NOR gates, and 7 is an OR gate.

When the address Ai is changed from the low level to the high level and from the high level to the low level, as shown by (a) in FIG. 8, the output of the inverter 1 is changed as shown by (b). The output of the inverter 2 is delayed by influence of the capacitor 8, as shown by (d), and the output of the NOR gate 5 becomes as shown by (f). The outputs of the inverters 3 and 4 are changed as shown by (e) and (c), and the output of the NOR gate 6 becomes as shown by (g). Consequently, the output of the OR gate 7, i.e., the clock signal $\phi'$ becomes as shown by ($\phi'$).

Figure 9:
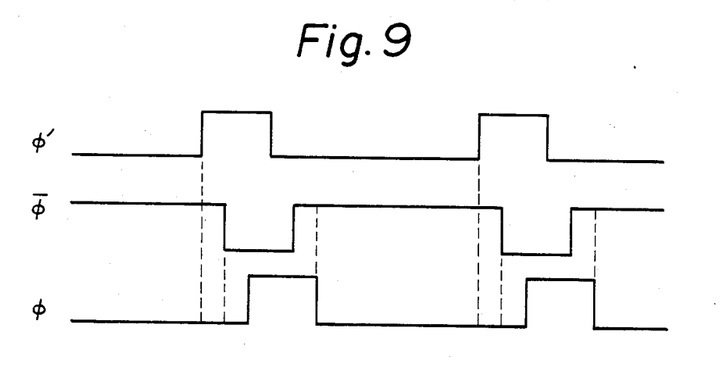
FIG. 9 is a timing chart for comparing each of clock signals $\phi'$, $\bar{\phi}$ and $\phi$ in detail.

FIG. 9 is a timing chart for comparing each of the clock signals $\phi'$, $\bar{\phi}$, and $\phi$. As can be seen from the drawing, this timing chart illustrates in detail each of the timings of the address signal ADD (i.e., clock signal $\phi'$), and clock signals $\bar{\phi}$ and $\phi$ shown in FIG. 6.

Figure 10:
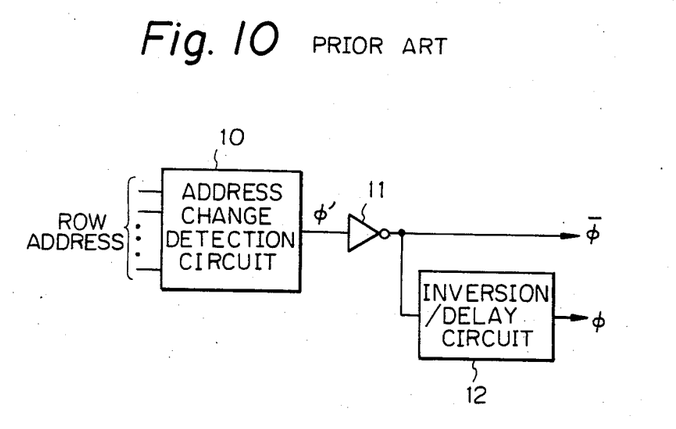
FIG. 10 is a schematic block diagram of a conventional clock generating circuit.
Figure 11:
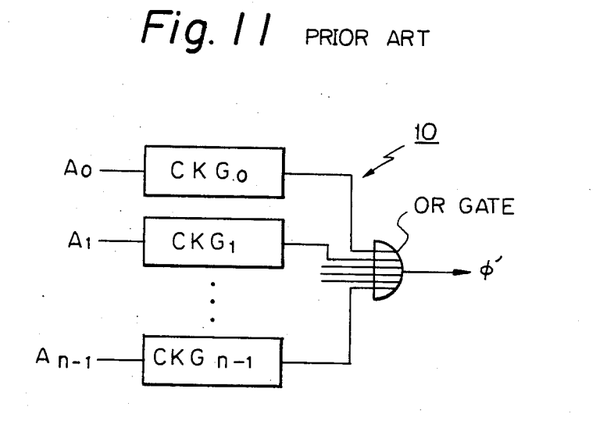
FIG. 11 is a detailed block diagram of the address change detection circuit shown in FIG. 10; and, FIG. 12 is a schematic block diagram of a MOS static memory using an equalizing circuit according to the present invention.

FIG. 10 shows a clock generating circuit which comprises an address change detection circuit 10, an inverter 11, and an inversion/delay circuit 12. The address change detection circuit 10 is constituted by a plurality of clock circuits $CKG_i$ shown in FIG. 7, and the interconnection of the clock circuit $CKG_i$ is shown in FIG. 11. That is, $CKG_0$ to $CKG_{n-1}$ are the same circuits as that of FIG. 7.

In FIG. 10, the clock signal $\phi'$ obtained by the detection circuit 10 is inverted by the inverter 11 and the inverted clock signal $\bar{\phi}$ is obtained from the output of the inverter 11. The clock signal $\bar{\phi}$ is inverted by the inversion delay circuit 12 and the clock signal $\phi$ is obtained from the output of the circuit 12. The circuit 12 is constituted by, for example, an inverter circuit or a Schmitt trigger circuit and delay circuit.

Figure 12:
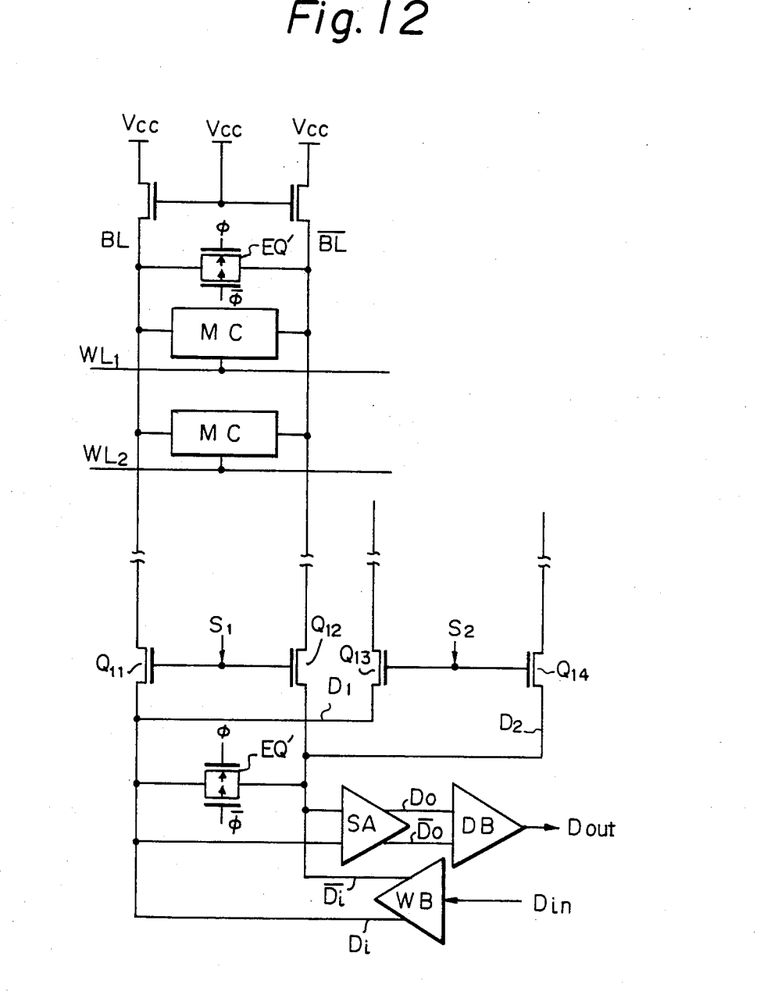

FIG. 12 is a schematic block diagram of the MOS static RAM. As can be seen from the drawing, the circuit according to the present invention is used for equalizing the data bus lines $D_1$, and $D_2$, and the same effect as the equalization of the bit lines is obtained by this additional circuit. In FIG. 12, SA is a sense amplifier, DB is a data out buffer, and WB is a write buffer, $D_0$ and $\bar{D}_0$ are read data, $D_i$ and $\bar{D}_i$ are write data. $D_0$ and $\bar{D}_0$ have a complementary relationship, and $D_i$ and $\bar{D}_i$ also have a complementary relationship. Transistors $Q_{11}$, $Q_{12}$, $Q_{13}$, and $Q_{14}$ are used as column transfer gates. Transistors $Q_{11}$ and $Q_{12}$ are turned ON by a column selection signal $S_1$ transmitted from a column decoder (not shown). Transistors $Q_{13}$ and $Q_{14}$ are turned ON by the column selection signal $S_2$ transmitted from the column decoder (not shown).

What is claimed is:

1. A semiconductor memory device comprising a memory cell selected by an address signal, at least a pair of signal lines for receiving complementary signals corresponding to information stored or to be stored in said memory cell, and an equalizing circuit connected between said signal lines for equalizing the potential of said signal lines, said equalizing circuit comprising a P-channel type MIS transistor and an N-channel type MIS transistor connected in parallel, and first means for temporarily turning ON said P-channel type MIS transistor and said N-channel type MIS transistor in response to a change of said address signal.

2. A semiconductor memory device as claimed in claim 1, wherein said first means turns ON said P-channel type MIS transistor before it turns ON said N-channel type MIS transistor.

3. A semiconductor memory device as claimed in claim 1, wherein said first means turns OFF said P-channel type MIS transistor before it turns OFF said N-channel type MIS transistor.

4. A semiconductor memory device as claimed in claim 1, wherein said pair of signal lines is a pair of bit lines connected to said memory cell.

5. A semiconductor memory device as claimed in claim 1, wherein said pair of signal lines is a pair of data bus lines.

6. A semiconductor memory device as claimed in claim 1, comprising second means for outputting selection and non-selection signals for selecting said memory cell depending on said address signal, wherein said selection and nonselection signals have a common low level for a predetermined period, and said pair of signal lines are equalized at least in part during said predetermined period.

7. A semiconductor memory device as claimed in claim 6, wherein said first means provides first and second gate signals respectively to said N- and P-channel type MIS transistors for turning them ON and OFF, said second gate signal is at a high level up until after the beginning of the fall of said non-selection signal, and said first gate signal does not rise until after the fall of said selection signal and of said second gate signal.

8. A semiconductor memory device as claimed in claim 6, wherein said equalizing of said pair of signal lines by said equalizing circuit has the characteristic of having a weak equalizing effect for said pair of signal lines during an initial step, a strong equalizing effect during an intermediate step, and a weak equalizing effect at an end step, and said selection and non-selection signals overlap in part with the time during which part of the equalizing of said pair of signal lines occurs.

9. A semiconductor memory device as claimed in claim 8, wherein said characteristic of said equalizing of said pair of signal lines is due to limiting an overdrive capacity of said P-channel type MIS transistor by turning said P-channel type transistor back OFF before turning said N-channel type transistor back OFF after said temporarily turning ON of said N- and P-channel type MIS transistors by said first means.

* * * * *

UNITED STATES PATENT AND TRADEMARK OFFICE
CERTIFICATE OF CORRECTION

PATENT NO. : 4,656,608
DATED : April 7, 1987
INVENTOR(S) : Keizo Aoyama

It is certified that error appears in the above-identified patent and that said Letters Patent is hereby corrected as shown below:

Column 1, line 27, "Unexaminated" should be --Unexamined--;
line 49, delete "a".

Column 3, line 45, "typek," should be --type,--.

Column 6, line 26, "$D_0$" (first and third occurrences) should be --$\overline{D}_0$--, "$D_i$" (second occurrence) should be --$\overline{D}_i$--;

line 27, "$D_i$" (second occurrence) should be --$\overline{D}_i$--.

Signed and Sealed this

Twenty-fifth Day of August, 1987

*Attest:*

DONALD J. QUIGG

*Attesting Officer*   *Commissioner of Patents and Trademarks*